United States Patent
Dupont et al.

(10) Patent No.: US 7,760,155 B2
(45) Date of Patent: *Jul. 20, 2010

(54) INTEGRATED COUPLER

(75) Inventors: François Dupont, Tours (FR); Patrick Poveda, Villedomer (FR)

(73) Assignee: STMicroelectronics S.A., Montrouge (FR)

( * ) Notice: Subject to any disclaimer, the term of this patent is extended or adjusted under 35 U.S.C. 154(b) by 2 days.

This patent is subject to a terminal disclaimer.

(21) Appl. No.: 12/035,458

(22) Filed: Feb. 22, 2008

(65) Prior Publication Data

US 2008/0158090 A1 Jul. 3, 2008

Related U.S. Application Data

(63) Continuation of application No. 10/949,941, filed on Sep. 24, 2004, now Pat. No. 7,375,603.

(30) Foreign Application Priority Data

Oct. 3, 2003 (FR) .................... 03 50643

(51) Int. Cl.
*H01Q 1/50* (2006.01)
*H01P 5/00* (2006.01)
(52) U.S. Cl. .................... 343/850; 333/24 R
(58) Field of Classification Search ................ 343/850, 343/852, 858; 333/117, 24 R, 103, 15
See application file for complete search history.

(56) References Cited

U.S. PATENT DOCUMENTS

| | | | |
|---|---|---|---|
| 3,296,527 A | 1/1967 | Cones | |
| 4,044,373 A | 8/1977 | Nomiya et al. | |
| 4,059,803 A * | 11/1977 | Mikhailovsky | 455/330 |
| 4,578,695 A | 3/1986 | Delaporte et al. | |
| 4,603,310 A * | 7/1986 | Yarman | 333/139 |
| 5,352,994 A | 10/1994 | Black et al. | |
| 5,532,646 A | 7/1996 | Aihara | |
| 6,660,688 B2 | 12/2003 | Yamada et al. | |
| 7,375,603 B2 * | 5/2008 | Dupont et al. | 333/24 R |

OTHER PUBLICATIONS

French Search Report from French Patent Application 03/50643 filed Oct. 3, 2003.
Patent Abstracts of Japan, vol. 012, No. 204 (E-620), Jun. 11, 1988 & JP 63 002404 A (Kokusai Electric Co Ltd.).
Patent Abstracts of Japan, vol. 013, No. 195 (E-754), May 10, 1989 * JP 01 016119 A (NEC Corp.).
Caverly, R.H. et al , *Establishing the Minimum Reverse Bias for a p-i-n Diode in a High-Power Switch*, IEEE Transactions on Microwave Theory and Techniques, vol. 38, No. 12, Dec. 1990, pp. 1938-1943.
Hiller, G, et al., *The Reverse Bias Requirement for Pin Diodes in High Power Switches and Phase Shifters*, 1990 IEEE MTT-S Digest, CH2848-0/90/0000-1321, pp. 13211324.
Doherty, B, *Pin Diode Fundamentals*, Microsemi, MicroNote Series 701, 2 pages.

* cited by examiner

*Primary Examiner*—HoangAnh T Le
(74) *Attorney, Agent, or Firm*—Lisa K. Jorgenson; James H. Morris; Wolf, Greenfield & Sacks, P.C.

(57) ABSTRACT

A non-directional coupler including a semiconductor junction in series with a capacitor, the semiconductor junction being formed so that the threshold frequency short of which it behaves as a rectifier is smaller than the coupler's operating frequency.

10 Claims, 2 Drawing Sheets

$f_s < f_o$,
where $f_s$ = semiconductor junction threshold frequency
$f_o$ = coupler operating frequency

INTEGRATED COUPLER

CROSS REFERENCE TO RELATED APPLICATIONS

This application is a continuation of U.S. application Ser. No. 10/949,941, filed Sep. 24, 2004 entitled INTEGRATED COUPLER, which application is incorporated herein by reference in its entirety.

BACKGROUND OF THE INVENTION

1. Field of the Invention

The present invention relates to the field of couplers having the function of sampling part of the power present on a main line towards a secondary line for control and feedback. Couplers are generally used in closed-loop gain-control systems to provide a real measurement of the power.

2. Discussion of the Related Art

FIG. 1 very schematically shows an example of a conventional circuit using a coupler. This example relates to the control of a power amplifier 1 (PA) for amplifying a useful signal UTI for a transmit antenna 2. In this type of application, the transmit power is controlled with a power reference PL. A coupler 3 is interposed between the output of amplifier 1 and antenna 2 to extract data proportional to the power actually transmitted. This data is exploited by a detector 4 (DET) providing a measured value MES to a comparator 5 with required power PL. Comparator 5 provides a control signal REG to amplifier 1.

Two large coupler categories are essentially known. A first category relates to so-called distributed couplers, which are formed from coupled transmission lines. A second category relates to couplers with local components, based on capacitors and inductances.

Distributed couplers are directional, that is, they detect the direction of the measured power and are sensitive to dimensional variations of the lines. Such couplers are bulky due to the size of the lines to be formed, especially for radio frequency applications (from several hundreds of MHz to a few GHz).

Couplers with local components are non-directional. They have the advantage of having a large passband and of being more compact.

As illustrated in FIG. 1, a coupler is defined by four ports or terminals IN, DIR, CPLD, and ISO. Terminals IN and DIR are on the main line while terminals CPLD and ISO define the coupled secondary line. In FIG. 1, terminal IN is on the side of power amplifier 1 while terminal DIR is on the side of antenna 2. Terminal CPLD is the terminal on which is sampled the information proportional to the power in the main line. In a non-directional coupler, to which the present invention applies, terminals IN and DIR are one and the same and terminal ISO generally does not exist.

The main parameters of a non-directional coupler are:

the coupling factor (generally on the order of from 10 to 30 dB) which corresponds to the path loss between ports IN and CPLD (the other port being loaded with a standardized impedance, generally 50 ohms); and the insertion loss in the desired passband which corresponds to the path loss between ports IN and DIR (the other port being loaded with a standardized impedance, generally 50 ohms) and which is desired to be as small as possible (smaller than 1 dB and preferably on the order of 0.5 dB) to minimize the attenuation of the wanted signal due to the presence of the coupler.

FIG. 2 shows the electric diagram of a conventional non-directional coupler with local components. Such a coupler is essentially formed of the association of two cells 31 and 32 respectively forming high-pass and low-pass filters. Cell 31 comprises a capacitor C31 having a first electrode connected to transmit line 12 (confounded terminals IN and DIR) and having a second electrode connected, by an inductance L31, to ground. The second electrode of capacitor C31 also constitutes an input terminal of cell 32 formed of an inductance L32 connecting this second electrode to terminal CPLD, terminal CPLD being further grounded by a capacitor C32.

A disadvantage of passive couplers with local components such as that illustrated in FIG. 2 is linked to the dispersions (on the order of 20%) of the inductive and capacitive components upon manufacturing thereof. Such dispersions are reflected on the coupler parameters, which are given for an operating frequency band.

Theoretically, it is also possible to form high-pass and low-pass filters based on resistive and capacitive elements to form a coupler. However, the required number of stages (filter order) results, in practice, in a large size filter. Further, the dispersion problem is also present for resistors.

Above all, such structures are, in practice, not integrable in high-frequency applications (over one hundred MHz) more specifically aimed at by the present invention, due to the small required values, especially for capacitors (less than one picofarad).

SUMMARY OF THE INVENTION

The present invention aims at providing a novel integrable coupler architecture.

The present invention more specifically aims at providing a non-directional coupler, the parameters of which are free of the dispersion problems of conventional couplers with local components.

The present invention also aims at enabling easy and accurate setting of the values of the coupler components.

To achieve these and other objects, the present invention provides a non-directional coupler comprising a semiconductor junction in series with a capacitor, the semiconductor junction being formed so that the threshold frequency short of which it behaves as a rectifier is smaller than the coupler's operating frequency.

According to an embodiment of the present invention, said semiconductor junction is formed in an epitaxial layer, the thickness of which conditions the threshold frequency from which the junction no longer has a rectifying function.

According to an embodiment of the present invention, said capacitor has a value greater than 10 picofarads.

According to an embodiment of the present invention, the semiconductor junction is sized to exhibit, at the coupler's operating frequency, a series capacitance on the order of a few hundreds of femtofarads and a series resistance on the order of a few tens of ohms.

The foregoing objects, features, and advantages of the present invention will be discussed in detail in the following non-limiting description of specific embodiments in connection with the accompanying drawings.

DETAILED DESCRIPTION

Figure 1:
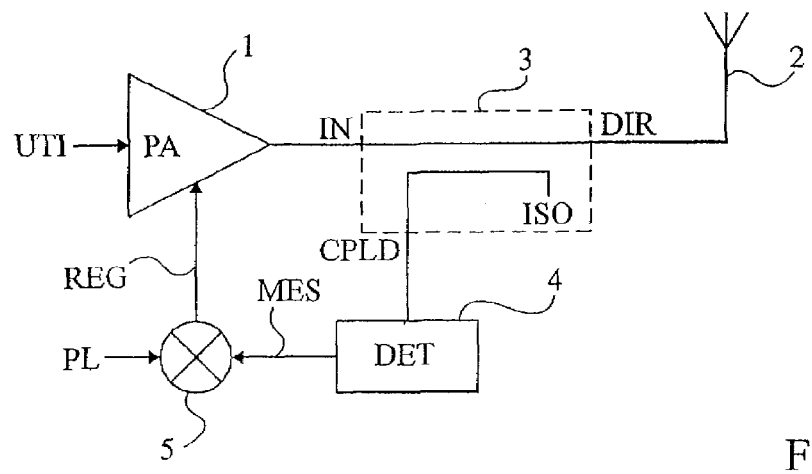
FIGS. 1 and 2, previously described, are intended to show the state of the art and the problem to solve.
Figure 2:
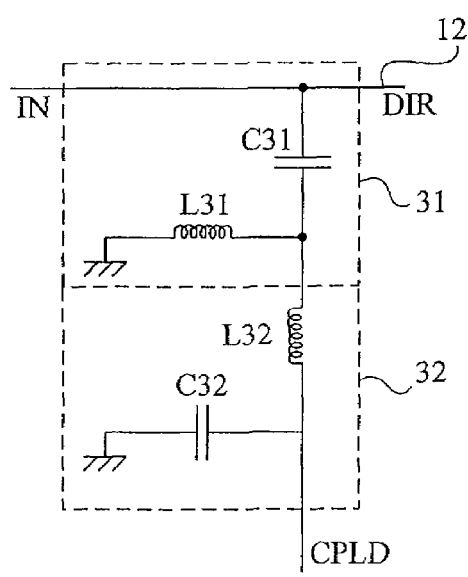

The same elements have been designated with the same reference numerals in the different drawings. For clarity, only those components which are necessary to the understanding of the present invention have been shown in the drawings and will be described hereafter. In particular, the exploitation that is made of the measurements performed by a coupler according to the present invention has not been described in detail, the present invention applying whatever the type of measurements performed and whatever the transmit line on which the coupler is connected.

A feature of the present invention is to form an integrated coupler in the form of a semiconductor junction (PN) in series with a capacitor.

Figure 3:
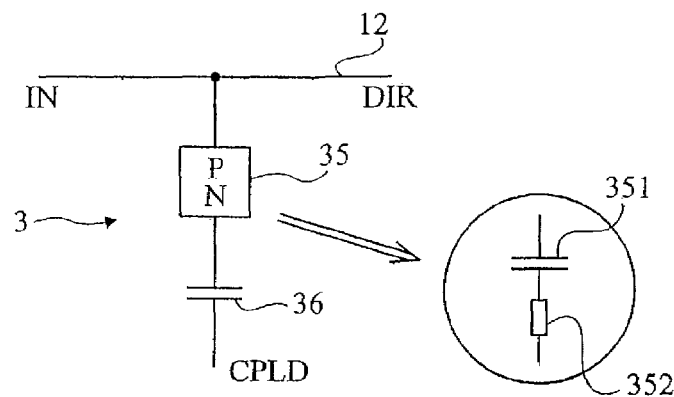
FIG. 3 shows the diagram of an embodiment of a coupler according to the present invention.

FIG. 3 shows an embodiment of a coupler 3 according to the present invention.

A PN junction 35 is connected by a first terminal (indifferently P or N) to transmit line 12 (confounded terminals IN and DIR) while its other terminal is connected to a first electrode of a capacitor 36 having its other electrode defining terminal CPLD of the coupler.

According to the present invention, PN junction 35 is used, not as a rectifying element but, at the frequencies desired for the coupler operation, to form a capacitor 351 in series with a resistor 352, both of very small value. "Very small value" means a capacitance 351 of less than one picofarad and a resistance 352 of less than 100 ohms. The PN junction is thus formed to avoid rectifying the signal at relatively high operating frequencies (greater than some hundred MHz) chosen for the coupler. According to a preferred example, it is formed with an intrinsic area (PIN diode), for example, in an epitaxial layer.

Capacitor 36 has the function of blocking the D.C. component. Its value is sufficient to be neglected in the series association with capacitor 351. Preferably, a value greater than 10 picofarads fulfils these requirements. The function of capacitor 36 will be better understood in relation with the description of FIG. 4 integrating the coupler in its application.

Figure 4:
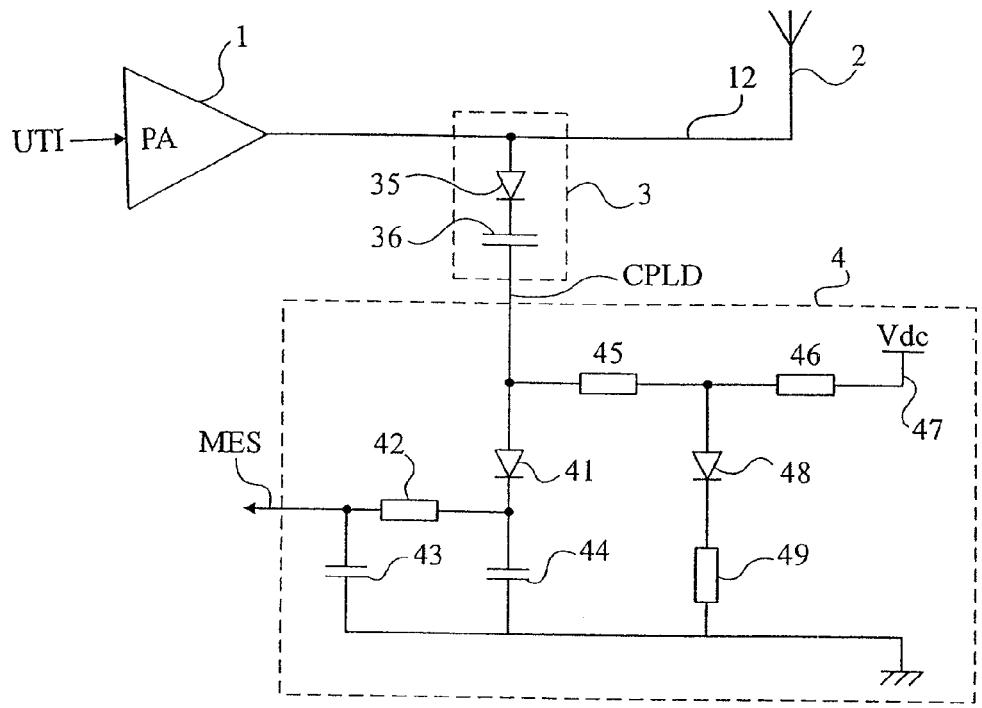
FIG. 4 shows a coupler according to the present invention connected to a detector of a control loop of the type illustrated in FIG. 1.

FIG. 4 shows a coupler 3 according to the present invention shown in the form of a diode 35 in series with a capacitor 36, and having its terminal CPLD connected to a detection circuit 4 providing a measurement signal MES for a comparator. Circuit 4 is a conventional circuit, for example, of the type illustrated in FIG. 1. It comprises a rectifying element 41 (for example, a diode) having its anode connected to terminal CPLD and having its cathode connected, via a capacitor 44, to ground. The cathode of element 41 is further connected, by a resistor 42, to terminal MES which is grounded by a capacitor 43. Capacitors 43 and 44 form with resistor 42 a low-pass filter reducing the ripple of the D.C. signal sampled on terminal MES.

Detector 4 further comprises a temperature-compensated bias circuit setting a level Vdc on the anode of diode 41. This circuit is formed of two resistors 45 and 46 in series between a terminal 47 of application of voltage Vdc and the anode of diode 41. The midpoint of this series connection is grounded by a diode 48 in series with a resistor 49. Such an assembly enables obtaining an exploitable level even for low powers of signals carried on main line 12 (smaller than 0 dBm). Without this biasing, diode 41 would be blocked for such levels. However, the presence of this bias voltage requires using capacitor 36 to avoid a continuous biasing of PN junction 35 of coupler 3, which would null out the desired operation.

Figure 5:
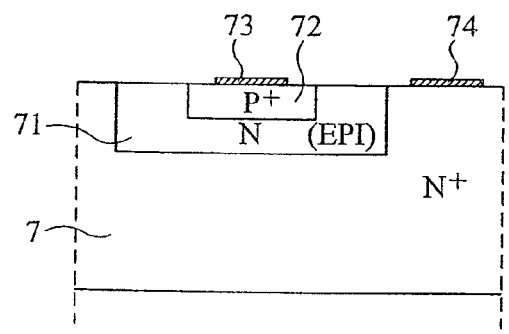
FIG. 5 shows in a very simplified cross-section view, an example of the forming of a coupler in a silicon wafer according to the present invention.

FIG. 5 illustrates an example of integration in a silicon substrate 7 of a PN junction 35 of a coupler according to the present invention. To obtain the desired absence of a rectifying effect, an epitaxial region 71 is provided between a P+ doped region 72 and N+ doped substrate 7. This is an example, and the doping types may be inverted. A first (anode) contact 73 is taken on region 72 and a second (cathode) contact 74 is taken on the N+ region that is, on substrate 7.

Other junction configurations may be envisaged provided to respect the absence of a rectifying effect at the desired operating frequencies. For example, the PN junction may be formed from a diode-assembled NPN-type bipolar transistor (connected base and collector).

The threshold frequency fs from which the PN junction no longer rectifies the signal is a function of the carrier transit time (designated as tt). This frequency is proportional to the inverse of the transit time.

If the main line signal has a frequency greater than threshold frequency fs, the voltage switches from a negative value to a positive value and conversely, with a periodicity smaller than the transit time. The forward incursion is too steep to cause a current and the carrier is carried off by the negative halfwave before recombining, and thus before generating a rectified current. Under such circumstances, the PN junction is considered as a capacitor in series with a resistor.

As a first approximation, it can be considered that the transit time essentially is a function of the epitaxial layer thickness and of the carrier diffusion coefficient. More specifically, time tt is proportional to $W^2/D$, where W represents the thickness of the epitaxial layer and D represents the carrier diffusion coefficient.

For a diffusion coefficient of carriers D on the order of 13 $cm^2/s$, which is a usual value in present technologies, frequency fs approximately is $1300/W^2$ (fs in MHz and W in μm). Generally, in light dopings used to form the diodes, diffusion coefficient D of the carriers can be considered as being constant. Accordingly, the smaller the thickness of the epitaxial layer, the higher the frequency from which the PN junction does not have a rectifying behavior.

It should be noted that the doping level of the regions has but little influence on the threshold frequency of the PN junction.

A specific example of application of the present invention relates to couplers used in the field of mobile telephony (GSM and DCS). The value of capacitor 351 is on the order of a few hundreds of femtofarads. This value resulting from the diode forming can be adjusted by setting, according to the desired response and taking into account possible stray capacitances, especially the epitaxy doping, the active surface, and the epitaxy thickness in case of a full depletion. Such a value is compatible with frequencies on the order of one GHz.

Similarly, resistive component 352 is on the order of a few tens of ohms, which is compatible with the forming of a PN junction and, again, adjustable according to the desired characteristics, by setting the interval between the P+ and N+ regions.

It should be noted that, in case of an integration with the detection circuit, the anode of the diode thus formed directly forms the terminal on which line 12 is connected, that is, the antenna and the output of the power amplifier.

An advantage of a PN junction to form the coupler is that, in the form of an active coupler, its parameters are controllable even for small capacitance and resistance values, with a much smaller dispersion (linked to the semiconductor technology). The "active" coupler thus becomes integrable. It can then be integrated on a same chip as that of the detection circuit (4, FIG. 4).

The values to be given to resistance 352 and capacitance 351 by the configuration of junction 35 are determined by usual modeling and simulation tools according to the desired and/or acceptable coupling factor and insertion loss at the selected operating frequencies.

Of course, the present invention is likely to have various alterations, modifications, and improvements which will readily occur to those skilled in the art. In particular, the practical forming of a diode fulfilling the constraints given by the present invention to form a coupler is within the abilities of those skilled in the art based on the functional and sizing indications given hereabove. Further, the present invention applies for a lateral diode as well as for a diode made in a vertical technology and whatever the type of formed diode (PN diode, PIN diode, etc.), provided that it is sufficiently slow with respect to the desired operating frequencies.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A non-directional coupler having an operating frequency band, the coupler comprising:
   a capacitor having a value greater than 10 picofarads; and
   a semiconductor junction in series with the capacitor, the semiconductor junction having a threshold frequency below which the semiconductor junction behaves as a rectifier; wherein
   the threshold frequency is less than the coupler's operating frequency band; and
   the coupler's operating frequency band includes frequencies over one hundred MHz.

2. The coupler of claim 1, wherein the semiconductor junction is disposed in an epitaxial layer, wherein a thickness of the epitaxial layer determines the threshold frequency above which the semiconductor junction no longer functions as a rectifier.

3. The coupler of claim 1, wherein the semiconductor junction is sized to exhibit, at the coupler's operating frequency within the coupler's operating frequency band, a series capacitance of a few hundreds of femtofarads and a series resistance of a few tens of ohms.

4. An antenna circuit comprising:
   an antenna;
   a power amplifier configured to amplify a signal for the antenna, the power amplifier having an output that is configured to send the amplified signal to the antenna; and
   a coupler interposed between the output of the power amplifier and the antenna, the non-directional coupler comprising:
   a capacitor having a value greater than 10 picofarads;
   a semiconductor junction in series with the capacitor, the semiconductor junction being formed to have a threshold frequency, the threshold frequency representing a frequency below which the semiconductor junction would behave as a rectifier; and
   a coupler operating frequency band, the operating frequency band including frequencies over 100 MHz; wherein
   the threshold frequency is smaller than the frequencies within the coupler operating frequency band such that the semiconductor junction does not behave as a rectifier at frequencies within the coupler operating frequency band.

5. The antenna circuit of claim 4, wherein the non-directional coupler is configured to extract data proportional to power transmitted to the antenna.

6. The antenna circuit of claim 5, further comprising a detector and a comparator, wherein the detector uses the extracted data to provide a measured value to the comparator, and wherein the comparator provides a control signal to the power amplifier.

7. A non-directional coupler having an operating frequency band of over 100 MHz, the coupler comprising:
   a semiconductor junction in series with a capacitor, the capacitor having a value greater than 10 picofarads, and the semiconductor junction being formed so that the threshold frequency short of which the semiconductor junction behaves as a rectifier is smaller than the coupler's operating frequency band of over 100 MHz.

8. The coupler of claim 7, wherein said semiconductor junction is formed in an epitaxial layer, the thickness of which conditions the threshold frequency.

9. The coupler of claim 7, wherein the semiconductor junction is sized to exhibit, at the coupler's operating frequency band of over 100 MHz, a series capacitance on the order of a few hundreds of femtofarads and a series resistance on the order of a few tens of ohms.

10. A coupler comprising a semiconductor junction in series with a capacitor, the semiconductor junction being formed so that a threshold frequency of the semiconductor junction, short of which the semiconductor junction behaves as a rectifier, is smaller than the coupler's operating frequency, wherein said capacitor has a value greater than 10 picofarads.

* * * * *